United States Patent
Jiang et al.

(10) Patent No.: US 12,362,713 B2
(45) Date of Patent: Jul. 15, 2025

(54) MAXIMUM POWER DETECTION AND AUTOMATIC GAIN CONTROL FOR CAPACITIVE CLASS-D AMPLIFIERS

(71) Applicant: TEXAS INSTRUMENTS INCORPORATED, Dallas, TX (US)

(72) Inventors: Junmin Jiang, San Jose, CA (US); Yinglai Xia, Plano, TX (US); Yogesh Kumar Ramadass, San Jose, CA (US); Shailendra Kumar Baranwal, Murphy, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 24 days.

(21) Appl. No.: 17/175,789

(22) Filed: Feb. 15, 2021

(65) Prior Publication Data

US 2022/0263478 A1    Aug. 18, 2022

(51) Int. Cl.
*H03F 3/217*    (2006.01)
*H03G 3/30*    (2006.01)

(52) U.S. Cl.
CPC ............ *H03F 3/2171* (2013.01); *H03G 3/30* (2013.01); *H03G 2201/103* (2013.01)

(58) Field of Classification Search
CPC ...... H03F 3/2171; H03F 3/183; H03F 3/2173; H03F 3/38; H03F 3/217; H03F 2200/351; H03G 3/30; H03G 2201/103; H03G 11/04
USPC ....................................... 330/10, 251, 207 A
See application file for complete search history.

(56) References Cited

U.S. PATENT DOCUMENTS

| | | | | |
|---|---|---|---|---|
| 6,093,186 | A * | 7/2000 | Goble | A61B 18/1485 606/34 |
| 7,777,459 | B2 * | 8/2010 | Williams | H02M 3/155 323/266 |
| 8,514,025 | B2 * | 8/2013 | Lesso | H03F 1/30 330/297 |
| 8,576,591 | B2 * | 11/2013 | Phadke | H02J 1/10 363/124 |
| 8,643,436 | B2 * | 2/2014 | Ni | H03F 3/217 330/251 |
| 9,209,757 | B1 * | 12/2015 | Thandri | H03F 1/0227 |
| 9,402,128 | B2 * | 7/2016 | Waller, Jr. | H03F 1/0238 |
| 9,641,133 | B2 * | 5/2017 | Waller, Jr. | H03F 3/217 |
| 10,008,990 | B2 * | 6/2018 | Paton Alvarez | H03F 1/0211 |
| 10,256,779 | B2 * | 4/2019 | Polarouthu | H03F 1/0211 |
| 10,566,939 | B2 * | 2/2020 | Berkhout | H03F 3/2175 |
| 10,886,881 | B2 * | 1/2021 | Xia | H03F 3/2173 |
| 11,012,040 | B2 * | 5/2021 | Tsai | H03F 3/005 |

(Continued)

*Primary Examiner* — Khanh V Nguyen
(74) *Attorney, Agent, or Firm* — Mandy Barsilai Fernandez; Frank D. Cimino

(57) ABSTRACT

A system includes a charge pump having an input coupled to a first voltage and an output at a second voltage, the second voltage greater than the first voltage. The system also includes an amplifier having a first input, a second input, and a third input, the first input coupled to the output of the charge pump, the second input coupled to the first voltage, the third input coupled to an input signal, the amplifier having an amplified output signal. The system also includes a maximum power detector coupled to the amplifier, the maximum power detector operable to determine whether the amplified output signal has reached a threshold output level and to reduce a power of the amplified output signal responsive to the determination.

35 Claims, 11 Drawing Sheets

(56) References Cited

U.S. PATENT DOCUMENTS

| | | | |
|---|---|---|---|
| 11,356,082 B2 * | 6/2022 | Xia | H03L 7/081 |
| 2013/0207629 A1 * | 8/2013 | Engelhardt | H02M 3/156 |
| | | | 323/282 |

* cited by examiner

MAXIMUM POWER DETECTION AND AUTOMATIC GAIN CONTROL FOR CAPACITIVE CLASS-D AMPLIFIERS

BACKGROUND

In some amplifier applications, a "class-D" amplifier architecture is used. A class-D amplifier includes transistors that operate as switches and not as linear gain devices. Class-D amplifiers are used as audio amplifiers in some applications. Class-D amplifiers are used in home audio systems, car audio systems, mobile devices, hearing aids, powered speakers, and radio frequency power amplifiers, among other applications. A class-D amplifier provides a pulse width modulated output that switches between three voltage levels: ground, a battery voltage ($V_{BAT}$), and a linked voltage ($V_{LINK}$) that a charge pump provides to the class-D amplifier.

SUMMARY

In accordance with at least one example of the description, a method includes producing a second voltage, by a charge pump, based on a first supply voltage, the second voltage greater than the first supply voltage. The method also includes powering an amplifier with the first supply voltage and the second voltage. The method also includes receiving an input signal at the amplifier and producing an amplified output signal. The method includes using the first supply voltage, the second voltage, and a duty cycle of the input signal to determine whether the amplified output signal has reached a threshold output level. The method also includes reducing a power of the amplified output signal responsive to a determination that the amplified output signal has reached the threshold output level.

In accordance with at least one example of the description, a system includes a charge pump having an input coupled to a first voltage and an output at a second voltage, the second voltage greater than the first voltage. The system also includes an amplifier having a first input, a second input, and a third input, the first input coupled to the output of the charge pump, the second input coupled to the first voltage, the third input coupled to an input signal, the amplifier having an amplified output signal. The system also includes a maximum power detector coupled to the amplifier, the maximum power detector operable to determine whether the amplified output signal has reached a threshold output level and to reduce a power of the amplified output signal responsive to the determination.

In accordance with at least one example of the description, a system includes a charge pump including three capacitive boost stages, the charge pump configured to produce a second voltage based on an input voltage of a first voltage, the second voltage being approximately three times the first voltage. The system includes a multi-stage amplifier coupled to the first voltage, the second voltage and at least one pulse width modulated input signal, the multi-stage amplifier having a signal output. The method also includes a maximum power detector coupled to the multi-stage amplifier, the maximum power detector configured to determine whether the signal output has reached a threshold output level based on the first voltage, the second voltage and a duty cycle of the at least one pulse width modulated input signal. The multi-stage amplifier includes a gain controller configured to reduce a power of the signal output responsive to the determination.

BRIEF DESCRIPTION OF THE DRAWINGS

The same reference numbers are used in the drawings to designate the same or similar (whether functionally or structurally) features.

DETAILED DESCRIPTION

If a charge pump coupled to an amplifier uses capacitors rather than inductors to boost the voltage from the power supply (e.g., $V_{BAT}$), the charge pump is referred to as a capacitive boost stage. If the charge pump uses inductors to boost $V_{BAT}$, the charge pump is referred to as an inductive boost stage. In some cases, the capacitive boost stage has smaller size and cost than an inductive boost stage, and the capacitive boost stage also provides a stable $V_{LINK}$ that is approximately three times the size of $V_{BAT}$. As described below, as the load resistance of the amplifier approaches the output impedance of the capacitive boost stage, the output voltage ($V_O$) of the amplifier will decrease responsive to the duty cycle increasing. This decrease in $V_O$ causes a corresponding decrease in $V_{LINK}$, which reduces the loop stability of the amplifier. Therefore, after a specific operating point has been reached, power cannot be increased by increasing the duty cycle.

In examples described herein, a maximum power detector is configured to detect one or more conditions that indicate the amplifier has reached peak or maximum output power. Maximum output power is detected responsive to the existence of one of two conditions. The first condition is if the duty cycle reaches 100%. The second condition is if $V_{LINK}$ falls below a threshold, where the threshold is a predetermined multiple of $V_{BAT}$. Responsive to either condition being detected, additional circuitry reduces output power to ensure the stability of the amplifier. In one example, responsive to the maximum power being detected, the amplifier reduces a gain of an input stage to reduce the output power. These conditions are simple to detect and are insensitive to process, voltage, and temperature variations. Further, remedial actions taken responsive to the detection of either condition are effective in promoting amplifier stability.

Figure 1:
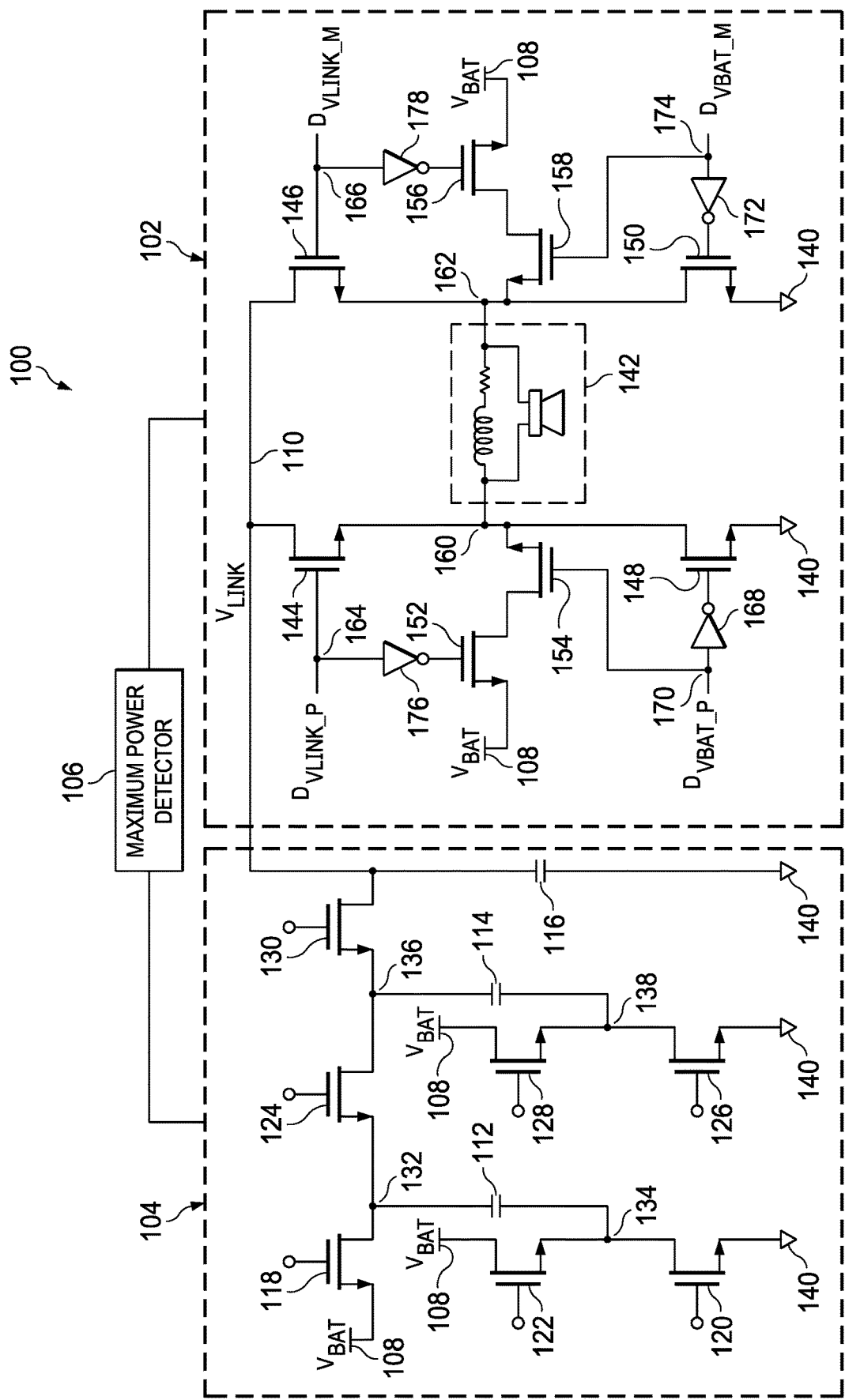
FIG. 1 is a schematic diagram of a system for maximum power detection for a class-D amplifier in accordance with various examples.

FIG. 1 illustrates a system 100 for maximum power detection for a class-D amplifier. System 100 includes a class-D amplifier 102, a charge pump 104, and a maximum power detector 106. Charge pump 104 converts a source voltage, such as a battery voltage $V_{BAT}$ at $V_{BAT}$ node 108, to a boosted voltage, such as $V_{LINK}$ at $V_{LINK}$ node 110. $V_{LINK}$ is greater than $V_{BAT}$. Charge pump 104 includes capacitors 112, 114, and 116, which are configured to increase the voltage from $V_{BAT}$ to $V_{LINK}$ at $V_{LINK}$ node 110. In this example, charge pump 104 has three stages due to the three capacitors 112, 114, and 116, and thus this charge pump is referred to as a 3X charge pump. Any number of stages are useful in other examples to increase the voltage at $V_{LINK}$ node 110 to any appropriate level.

Charge pump 104 also includes seven transistors 118, 120, 122, 124, 126, 128, and 130. In some examples, the seven transistors in charge pump 104 are field effect transistors (FETS). Each of the seven transistors has a gate terminal coupled to a controller (not shown). The controller provides control signals to the gate terminals of the transistors to turn the transistors on and off during operation. The source terminal of transistor 118 is coupled to $V_{BAT}$ node 108, and the drain terminal of transistor 118 connects to node 132. Capacitor 112 is coupled to node 132 and node 134. The drain terminal of transistor 120 and the source terminal of transistor 122 are coupled to node 134. The source terminal of transistor 120 is coupled to a common potential (e.g., ground 140). The drain terminal of transistor 122 is coupled to $V_{BAT}$ node 108.

The source terminal of transistor 124 is coupled to node 132, and the drain terminal of transistor 124 is coupled to node 136. Capacitor 114 is coupled to nodes 136 and 138. The drain terminal of transistor 126 and the source terminal of transistor 128 are coupled to node 138. The source terminal of transistor 126 is coupled to ground 140. The drain terminal of transistor 128 is coupled to $V_{BAT}$ node 108. The source terminal of transistor 130 is coupled to node 136, and the drain terminal of transistor 130 is coupled to $V_{LINK}$ node 110. Capacitor 116 is coupled to $V_{LINK}$ node 110 and ground 140.

In operation, during a first clock phase, transistors 118 and 120 are maintained in an on state, and capacitor 112 is charged to approximately $V_{BAT}$. Transistors 122 and 124 are maintained in an off state during this phase. During a second clock phase initiated after capacitor 112 is charged to approximately $V_{BAT}$, transistors 122, 124, and 126 are maintained in an on state. Capacitor 114 is charged to approximately twice $V_{BAT}$, while transistors 118, 120, 128, and 130 are maintained in an off state. Capacitor 114 reaches twice $V_{BAT}$ due to the cumulative effect of $V_{BAT}$ at node 108 and the voltage across capacitor 112. During a third clock phase initiated after capacitor 114 is charged to approximately twice $V_{BAT}$, transistors 128 and 130 are maintained in an on state and transistors 124 and 126 are maintained in an off state. Capacitor 116 is charged to approximately three times $V_{BAT}$. Therefore, the voltage at $V_{LINK}$ node 110 is approximately three times $V_{BAT}$. Charge pump 104 transfers power to $V_{LINK}$ node 110, and that power is transferred to a load 142 (shown as a speaker with an impedance that is modeled by a series-connected resistor and inductor).

Capacitors 112, 114, and 116 store charge such that the boosted voltage from charge pump 104 is available to amplifier 102 at any time. With this design, charge pump 104 is called a capacitive charge pump. No delay occurs such as the delay in inductor-based boost converters, which experience a delay while inductors store energy.

Amplifier 102 is a multi-stage amplifier that includes eight transistors (e.g., n-type metal-oxide-silicon FETS, nMOSFETs) 144, 146, 148, 150, 152, 154, 156, and 158. Amplifier 102 is a full-bridge class-D amplifier. In one example, an input signal to be amplified (such as an audio signal) is compared with a triangular wave to create a pulse width modulated (PWM) signal with a duty cycle that is proportional to the value of the input signal. The PWM signal is then provided to the four inputs of amplifier 102 (specifically, $D_{VLINK\_P}$, $D_{VLINK\_M}$, $D_{VBAT\_P}$ and $D_{VBAT\_M}$). The PWM signal includes a plus side (P) and an inverted minus side (M). The PWM signals provided to amplifier 102 are shown as plus side signals $D_{VLINK\_P}$ and $D_{VBAT\_P}$ on the left side of amplifier 102, and the inverted minus side signals $D_{VLINK\_M}$ and $D_{VBAT\_M}$ on the right side of amplifier 102. $D_{VLINK\_P}$ and $D_{VLINK\_M}$ are high side signals, while $D_{VBAT\_P}$ and $D_{VBAT\_M}$ are low side signals. These PWM signals turn the transistors of amplifier 102 on and off according to the input signal, which causes amplifier 102 to produce an amplified output signal at load 142. The drain terminals of transistors 144 and 146 are coupled to $V_{LINK}$ node 110. The source terminal of transistor 144 is coupled to an output node 160, which is a positive output node (OUTP) of amplifier 102. The gate terminal of transistor 144 is coupled to node 164. The source terminal of transistor 146 is coupled to output node 162, which is the negative (minus) output node (OUTM) of amplifier 102. The gate terminal of transistor 146 is coupled to node 166. Control signals are applied to the respective gate terminals of transistors 144 and 146 to control transistors 144 and 146. In an example, a $D_{VLINK\_P}$ signal is a pulse width modulated signal with a duty cycle that is provided to node 164 and controls transistor 144. In an example, a $D_{VLINK\_M}$ signal is a pulse width modulated signal with a duty cycle that is provided to node 166 and controls transistor 146. Transistors 144 and 146 are configured to provide $V_{LINK}$ from $V_{LINK}$ node 110 to output nodes 160 and 162.

Amplifier 102 also includes transistors 148 and 150. The source terminals of transistors 148 and 150 are coupled to common potential (such as ground) 140. A drain terminal of transistor 148 is coupled to output node 160, while the drain terminal of transistor 150 is coupled to output node 162. A gate terminal of transistor 148 is coupled to an output terminal of an inverter 168. The input of inverter 168 is coupled to node 170. In an example, a $D_{VBAT\_P}$ signal is a pulse width modulated signal with a duty cycle that is provided to node 170 and controls inverter 168, the output of which controls transistor 148. A gate terminal of transistor 150 is coupled to an output terminal of an inverter 172. The input of inverter 172 is coupled to node 174. In an example, a $D_{VBAT\_M}$ signal is a pulse width modulated signal with a duty cycle that is provided to node 174 and controls inverter 172, the output of which controls transistor 150. Transistors 148 and 150 are configured to provide ground 140 to output nodes 160 and 162, respectively.

Amplifier 102 also includes transistors 152, 154, 156, and 158. A source terminal of transistor 152 is coupled to $V_{BAT}$ node 108. The drain terminal of transistor 152 is coupled to the drain terminal of transistor 154. The gate terminal of transistor 152 is coupled to an output of an inverter 176. The input of inverter 176 receives the $D_{VLINK\_P}$ signal as described above. The $D_{VLINK\_P}$ signal is a pulse width modulated signal with a duty cycle that is provided to inverter 176 and controls the inverter 176, the output of which controls the transistor 152.

A source terminal of transistor 154 is coupled to output node 160. The gate terminal of transistor 154 is coupled to node 170. At node 170, the $D_{VBAT\_P}$ signal controls transistor 154.

A source terminal of transistor 156 is coupled to $V_{BAT}$ node 108. The drain terminal of transistor 156 is coupled to the drain terminal of transistor 158. The gate terminal of transistor 156 is coupled to an output of an inverter 178. The input of inverter 178 receives the $D_{VLINK\_M}$ signal as described above. The $D_{VLINK\_M}$ signal is a pulse width modulated signal with a duty cycle that is provided to inverter 178, the output of which controls transistor 156.

A source terminal of transistor 158 is coupled to output node 162. The gate terminal of transistor 158 is coupled to node 174. At node 174, the $D_{VBAT\_M}$ signal controls transistor 158.

Transistors 152 and 154 are configured to provide $V_{BAT}$ to output node 160. Also, transistors 156 and 158 are configured to provide $V_{BAT}$ to output node 162. In operation, voltages are applied to output nodes 160 and 162, and, by extension, to load 142 connected to the output nodes 160 and 162. In one example, load 142 is a speaker, which can be modeled as a load inductance and a load resistance.

Transistors 144, 146, 148, 150, 152, 154, 156, and 158 of amplifier 102 are controlled in multiple different modes of operation depending on the magnitude of an input signal to be amplified. For example, a lower power mode of operation is usable responsive to the input signal being less than a threshold value. A higher power mode of operation is usable responsive to the input signal being greater than the threshold level. The different modes of operation are described below with respect to FIGS. 3A and 3B.

System 100 includes maximum power detector 106. Maximum power detector 106 is described below. In one example, maximum power is detected when either one of two conditions are met. The first condition is when the duty cycle reaches 100%. The second condition is when $V_{LINK}$ falls below a threshold, where the threshold is a predetermined multiple of $V_{BAT}$. Responsive to either condition being met, the output power is reduced and/or limited to preserve the stability of amplifier 102. The output power can be reduced using any suitable method, as described below.

Figure 2:
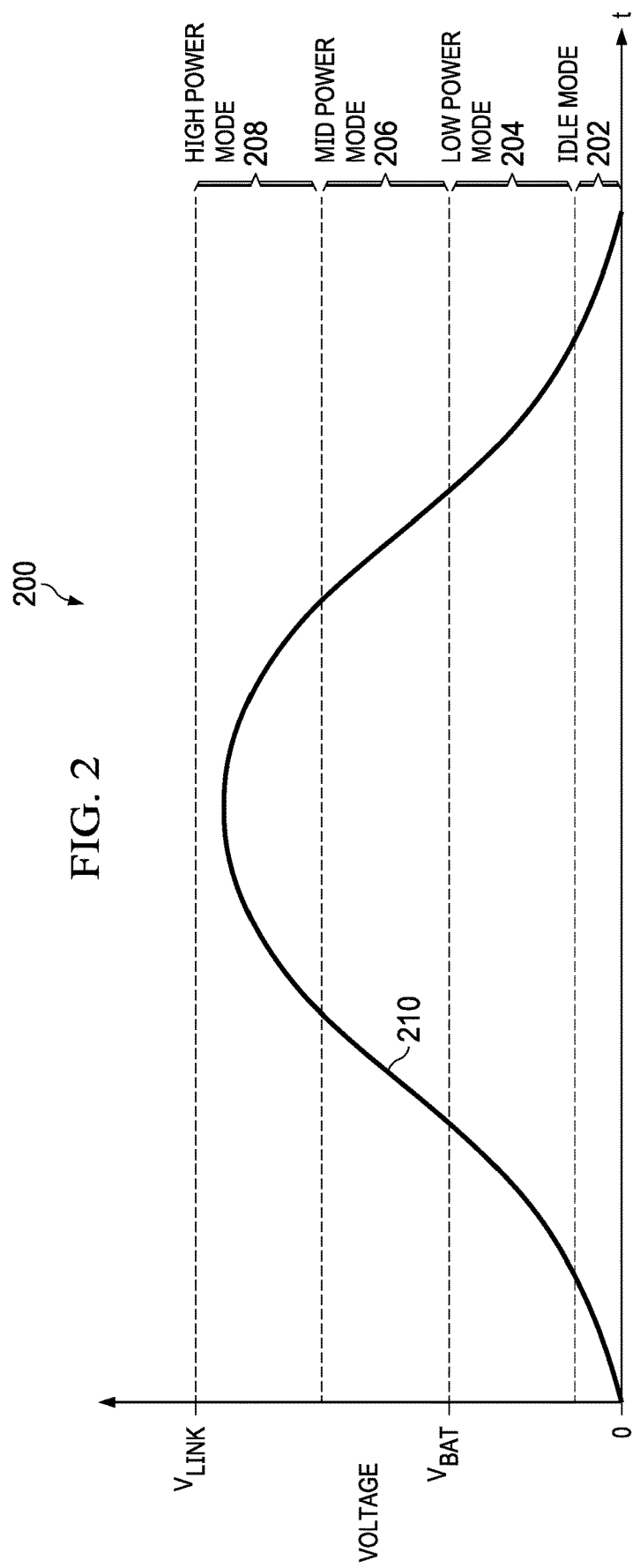
FIG. 2 is a graph of a voltage supply to an amplifier in accordance with various examples.

FIG. 2 is a graph 200 of a voltage supply (in volts) for an amplifier such as amplifier 102, during various modes of operation. Graph 200 shows four modes of operation (202, 204, 206, and 208) which are determined by a value of voltage supply 210 (e.g., the voltage at $V_{LINK}$ node 110). The various modes of operation occur at different times along the x-axis, with the value of the y-axis indicating a voltage corresponding to a mode of operation. Responsive to the voltage supply 210 being between 0 volts and a first threshold, the amplifier 102 operates in an idle mode 202. Responsive to the voltage supply 210 increasing to a voltage between the first threshold and VBAT, the amplifier 102 operates in a low power mode 204. In the idle mode 202 or the low power mode 204, charge pump 104 may be disconnected from amplifier 102 (e.g. by turning off transistors 144 and 146), and the voltage at output node 160 switches between $V_{BAT}$ and ground.

Responsive to the voltage supply 210 increasing to a voltage between $V_{BAT}$ and a second threshold, the amplifier 102 operates in a mid power mode 206. Responsive to the voltage supply 210 increasing above the second threshold, the amplifier 102 operates in a high power mode 208. In the mid power mode 206 or high power mode 208 of operation, charge pump 104 provides a boosted voltage to $V_{LINK}$ node 110, which delivers higher power to load 142. In mid power mode 206 or high power mode 208, the voltage at $V_{LINK}$ node 110 switches between the increased voltage $V_{LINK}$ from charge pump 104 and $V_{BAT}$.

Figure 3A:
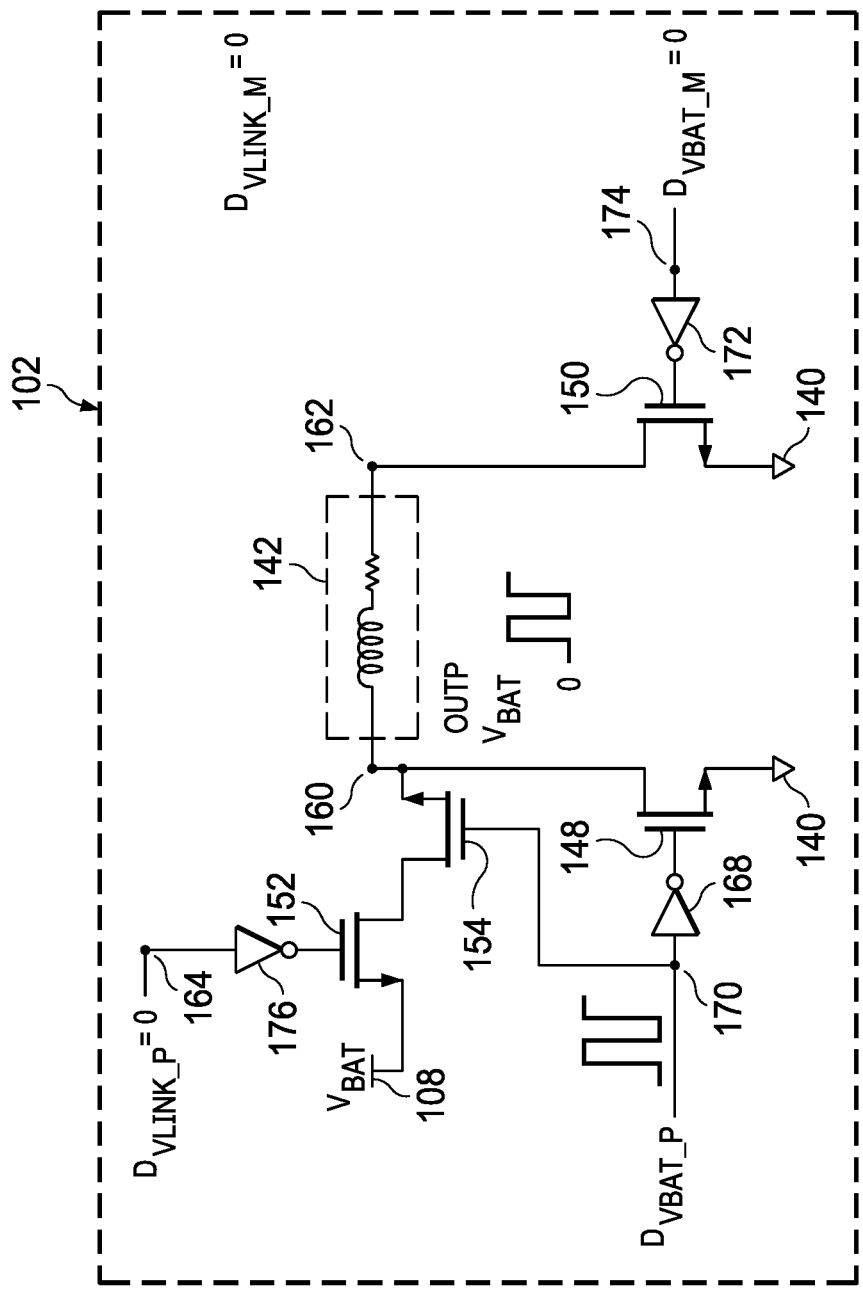
FIG. 3A is a schematic diagram of an amplifier operating in an idle mode or a low power mode in accordance with various examples.

FIG. 3A is a schematic diagram of amplifier 102 operating in an idle mode 202 or low power mode 204 as described above. In this example of the idle mode 202 or low power mode 204, the signals $D_{VLINK\_P}$, $D_{VLINK\_M}$, and $D_{VBAT\_M}$ are zero (duty cycle of 0%). $D_{VBAT\_P}$ control signal with a duty cycle of D is provided at node 170. For simplicity, not all components of amplifier 102 are shown, as those components are not active due to the three above control signals being zero.

In operation, the $D_{VBAT\_P}$ control signal, which is a pulse-width modulated signal with a duty cycle of D, is provided at node 170. Current flows from $V_{BAT}$ node 108, through transistors 152 and 154, to output node 160, and through load 142. Current also flows through transistor 150 to ground 140. Because the input signal is at $V_{BAT}$ or below, the voltage from the battery is sufficient to provide power for the operation of amplifier 102, and a higher voltage at $V_{LINK}$ node 110 is not useful at this point. Transistors 144 and 146 (not shown in FIG. 3A) are in an off state, and therefore charge pump 104 is disconnected from amplifier 102. As shown, the voltage at output node 160 toggles between 0 (ground) and $V_{BAT}$ in idle mode 202 or low power mode 204. A voltage at the output node, $V_O$, has the value of the duty cycle D of the $D_{VBAT\_P}$ control signal multiplied by $V_{BAT}$ ($V_O = D*V_{BAT}$).

Figure 3B:
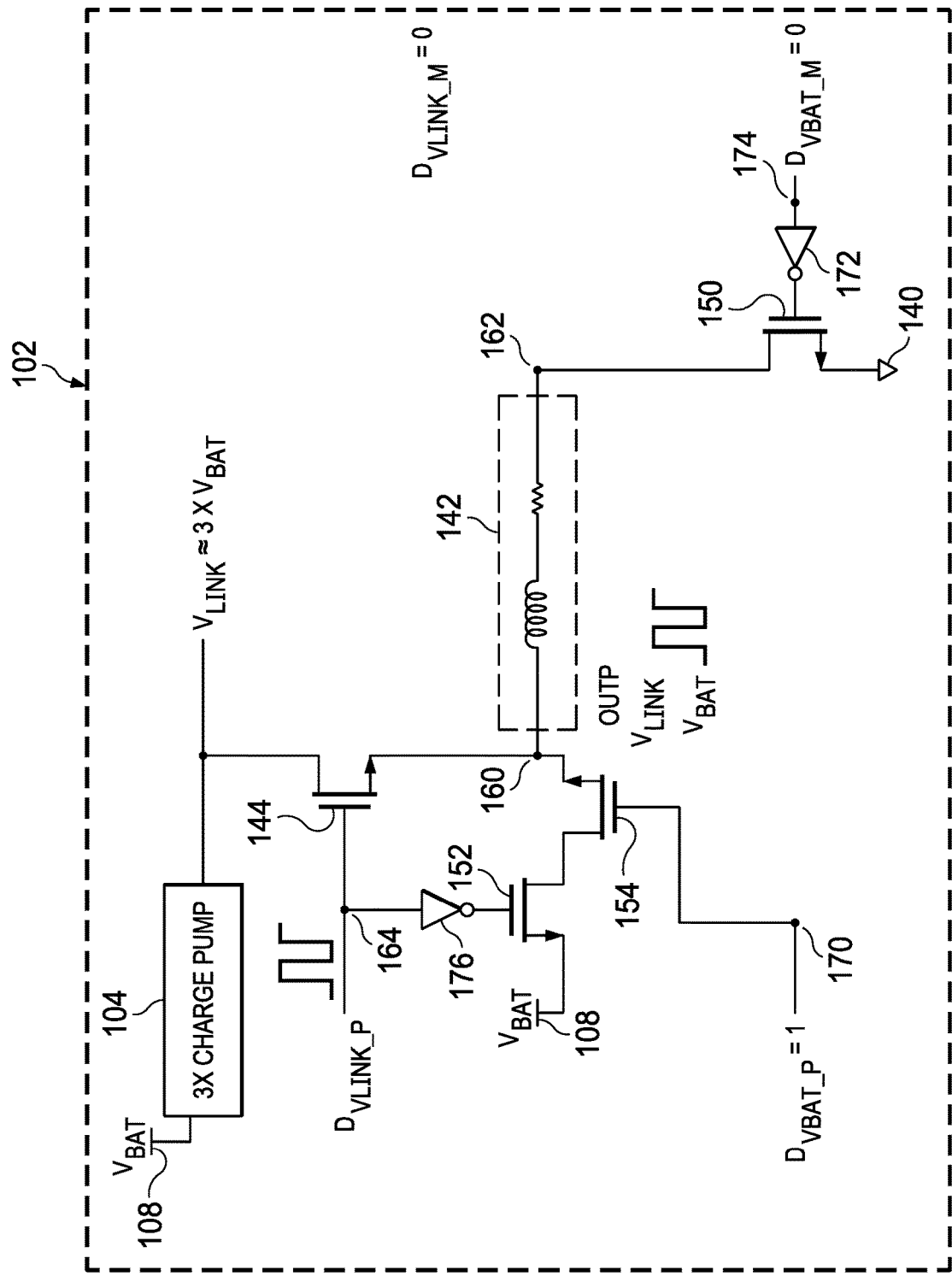
FIG. 3B is a schematic diagram of an amplifier operating in a mid power mode or high power mode in accordance with various examples.

FIG. 3B is a schematic diagram of amplifier 102 operating in a mid power mode 206 or a high power mode 208. In this example of the mid power mode 206 or the high power mode 208, the signals $D_{VBAT\_M}$ and $D_{VLINK\_M}$ are zero (duty cycle of 0%), and the signal $D_{VBAT\_P}$ is 1 (duty cycle of 100%). A $D_{VLINK\_P}$ control signal with a duty cycle of D is applied at node 164. For simplicity, not all components of amplifier 102 are shown, as those components are not active in this example.

In operation, current flows from charge pump 104 through transistor 144 to output node 160 and through load 142. Current also flows through transistors 152 and 154 to output node 160 and through load 142. Current also flows through transistor 150 to ground 140. As shown, the voltage at output node 160 toggles between $V_{BAT}$ and $V_{LINK}$ in mid power mode 206 or high power mode 208. The duty cycle D of the $D_{VLINK\_P}$ control signal determines how often $V_O$ at output node 160 is at $D_{VLINK}$ and how often $V_O$ is at $V_{BAT}$. The equation for $V_O$ is therefore $V_O = D_{VLINK} (1-D)V_{BAT}$. By applying a duty cycle D between 0 and 1, the output voltage $V_O$ is between $V_{LINK}$ and $V_{BAT}$.

Figure 4:
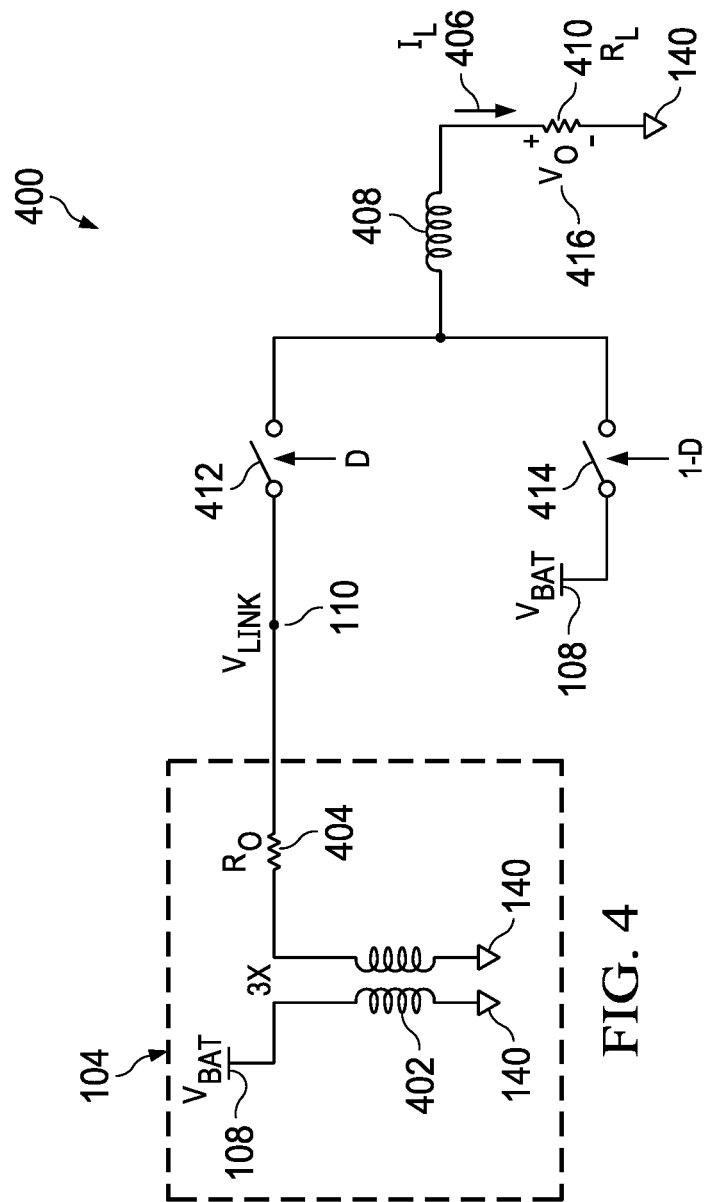
FIG. 4 is a circuit of a charge pump and amplifier in accordance with various examples.

FIG. 4 is a circuit 400 of charge pump 104 and amplifier 102 according to an example herein. Circuit 400 is used herein to determine when amplifier 102 reaches maximum power. In circuit 400, charge pump 104 is modeled, using a simplified equivalent circuit model, as a 3X transformer 402 coupled to an output impedance $R_O$ 404. The output impedance $R_O$ 404 is the equivalent resistance of the charge pump from input to output, and is found by measuring the input to output voltage difference and dividing by the load current. The output impedance $R_O$ 404 is coupled to $V_{LINK}$ node 110. Load current $I_L$ 406 travels from charge pump 104 through $V_{LINK}$ node 110, then through the load inductance 408 and the load resistance $R_L$ 410. Load current $I_L$ 406 flowing through output impedance $R_O$ 404 causes a voltage drop across output impedance $R_O$ 404. Due to this voltage drop, $V_{LINK}$ is not at exactly 3X $V_{BAT}$. The voltage at $V_{LINK}$ depends on the size of the load current $I_L$ 406 and the duty cycle D. Duty cycle D is represented by a switch 412 and is the ratio of time between 0 and 1 that $V_{LINK}$ is applied to the load. A switch 414 represents 1−D, which is the ratio of time between 0 and 1 that $V_{BAT}$ is applied to the load. The voltage at $V_{LINK}$ is shown in Equation 1:

$$V_{LINK}=3V_{BAT}-R_O*D*I_L \quad (1)$$

Also, the output voltage $V_O$ 416 is modeled as Equation 2:

$$V_O=D*V_{LINK}[(1-D)V_{BAT}] \quad (2)$$

In general, two conditions occur with circuit 400. The first condition is when the load resistance $R_L$ 410 is large compared to the output impedance $R_O$ 404 of charge pump 104. In an example, load resistance $R_L$ 410 may be 8 Ohms, such as an 8 Ohm speaker. Output impedance $R_O$ 404 may be approximately 2.6 Ohms in an example. In that case, load current $I_L$ 406 is small and therefore the voltage drop across output impedance $R_O$ 404 is not large. As duty cycle D increases, $V_{LINK}$ stays relatively constant because output impedance $R_O$ 404 voltage drop is not large. As duty cycle D increases, output voltage $V_O$ 416 increases. Therefore, increasing the duty cycle D increases the output power.

The second condition occurs when load resistance $R_L$ 410 is closer in value to output impedance $R_O$ 404 of charge pump 104. In an example, load resistance $R_L$ 410 may be approximately 3.2 Ohms and output impedance $R_O$ 404 may be approximately 2.6 Ohms. In that case, increasing the duty cycle D causes a higher increase in load current $I_L$ 406. This increase in current causes a larger voltage drop across output impedance $R_O$ 404, which causes $V_{LINK}$ to decrease. A decrease in $V_{LINK}$ causes a decrease in $V_O$. Therefore, after a certain output power is reached, $V_O$ will decrease with a duty cycle increase. This is shown in Equation 3:

$$(D+\Delta D)\Delta V_{LINK} < |\Delta D V_{BAT}| \quad (3)$$

Equation 3 indicates that maximum power in amplifier 102 is reached before the duty cycle D reaches 1. In that case, power cannot be increased by increasing the duty cycle D. The duty cycle D that corresponds to maximum power can be determined by solving a set of equations for the maximum D. The process begins with Equation 2 above and substituting for $V_{LINK}$ results in Equation 4:

$$V_O=D(3\,V_{BAT}-I_{CP}*R_O)+(1-D)V_{BAT} \quad (4)$$

where $I_{CP}$ is the current from charge pump 104. $I_{CP}$ equals the duty cycle D multiplied by $I_L$, or $D_{IL}$, which equals $DV_O/R_L$. Substituting for $I_{CP}$ in Equation 4 and rearranging yields Equation 5:

$$V_O = \frac{V_{BAT}(1+2D)}{1+D^2\frac{R_O}{R_L}} \quad (5)$$

Therefore, Equation 6 yields:

$$V_{LINK} = 3V_{BAT} - V_{BAT}\frac{D(1+2D)}{\frac{R_L}{R_O}+D^2} \quad (6)$$

To get the maximum duty cycle D, Equation 7 is used:

$$D_{MAX} = \sqrt{\frac{1}{4}+\frac{R_L}{R_O}} - \frac{1}{2} \quad (7)$$

Using Equation 7, if $D_{MAX}$ is less than 1, $V_{LINK,MAX}$ is $2V_{BAT}$. If $D_{MAX}$ is greater than or equal to 1, then maximum power occurs when D equals 1. Therefore, maximum power is reached when either the duty cycle D equals 1, or when $V_{LINK} < 2V_{BAT}$. The second condition is valid when a 3X charge pump is used. Other values for $V_{LINK}$ with respect to the maximum power occur when a different type of charge pump is used, such as a 2X or a 4X charge pump. In examples herein, maximum power detector 106 detects one or both of these two conditions and uses that detection to limit the output power of amplifier 102.

Figure 5:
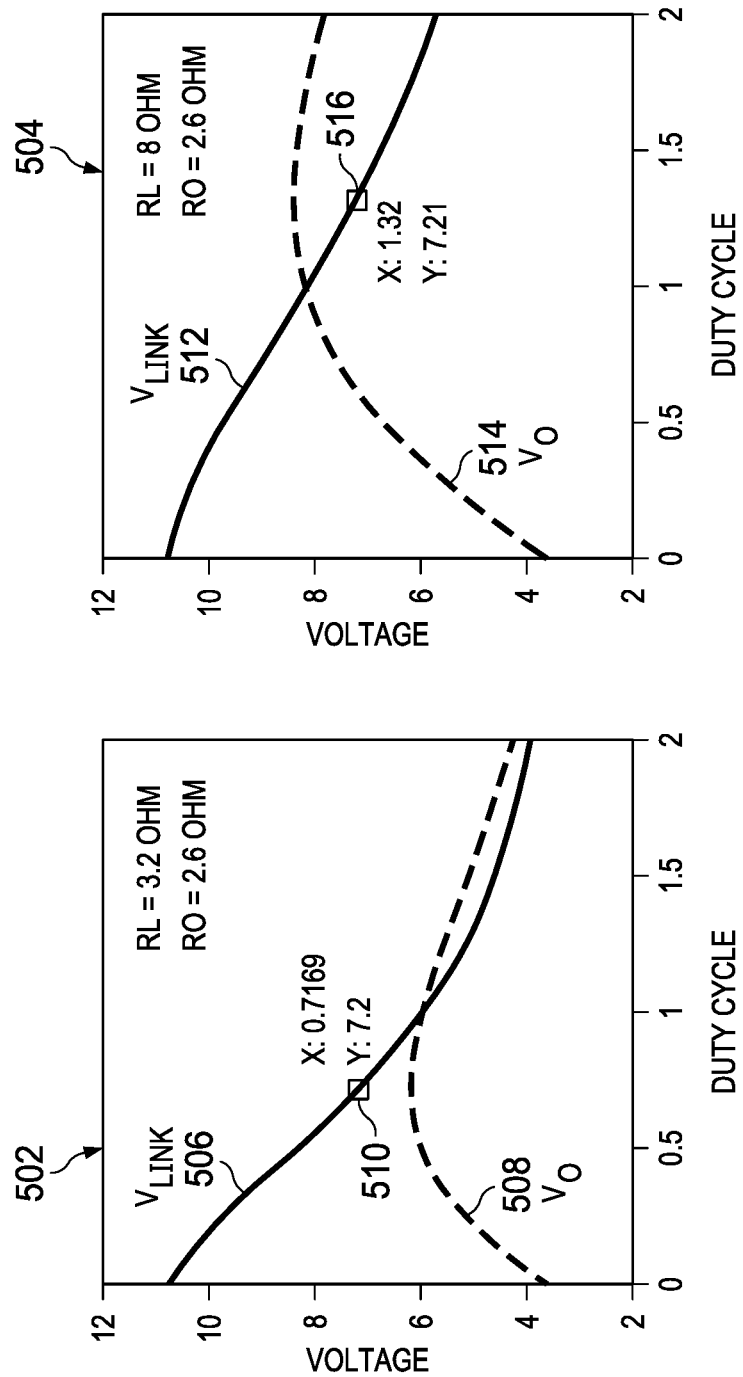
FIG. 5 is a pair of graphs plotting voltage against duty cycle for an amplifier in accordance with various examples.

FIG. 5 shows two graphs 502 and 504 of voltage (in volts) versus duty cycle for an example amplifier herein. The duty cycle is shown on the graph with a range of 0 to 2. In operation, the duty cycle ranges from 0 (100% off) to 1 (100% on). Duty cycles from 1 to 2 are only theoretical, and are shown from on the graphs to more fully illustrate the mathematical relationship between the curves on the graphs. Graphs 502 and 504 show the two conditions where maximum power is reached, which are the conditions that are detected by maximum power detector 106. The first condition where maximum power is reached, shown in graph 502, is when $V_{LINK} < 2V_{BAT}$. The second condition where maximum power is reached, shown in graph 504, is when the duty cycle equals 1.

In graph 502, voltage is graphed on the y-axis and duty cycle is graphed on the x-axis. In graph 502, the load resistance $R_L$ 410 (from FIG. 4) is approximately 3.2 Ohms, and the output impedance $R_O$ 404 is approximately 2.6 Ohms. $V_{BAT}$ is approximately 3.6 V in this example. Graph 502 shows a curve 506 of $V_{LINK}$ voltage and a curve 508 of output voltage $V_O$ 416. $V_{LINK}$ decreases as duty cycle increases for this scenario, with $V_{LINK}$ at about 10.7 V when the duty cycle is 0 and about 6.0 V when the duty cycle is 1. Curve 508 shows that output voltage $V_O$ 416 increases as duty cycle D increases from 0 to about 0.72. After that point, as duty cycle continues to increase, output voltage $V_O$ 416 starts to decrease. Graph 502 shows the phenomenon described above where maximum power, at $V_{LINK,MAX}$, occurs before D=1, at approximately $2V_{BAT}$. In this example, output voltage $V_O$ 416 cannot continue to increase as duty cycle D rises above 0.72 because $V_{LINK}$ decreases too quickly. Point 510 on curve 506 is the voltage point for $V_{LINK}$ where output voltage $V_O$ is saturated (e.g., reaches its maximum). Point 510 is at approximately 7.2 V, or $2V_{BAT}$.

Graph 504 is a graph of voltage versus duty cycle where load resistance $R_L$ 410 is much larger than output impedance $R_O$ 404. In this example, load resistance $R_L$ 410 is approximately 8.0 Ohms and output impedance $R_O$ 404 is approximately 2.6 Ohms. Graph 504 shows a curve 512 of $V_{LINK}$ voltage and a curve 514 of output voltage $V_O$ 416. $V_{LINK}$ decreases as duty cycle increases for this scenario, with $V_{LINK}$ at about 10.7 V when the duty cycle is 0 and about 8.2 V when the duty cycle is 1. Curve 514 shows that output voltage $V_O$ 416 increases as duty cycle D increases from 0 to 1, and output voltage $V_O$ 416 even theoretically continues to increase as the duty cycle D rises above 1 to about 1.32. Therefore, in the scenario where load resistance $R_L$ 410 is much greater than output impedance $R_O$ 404, output power increases over the entire range of duty cycle D from 0 to 1.

In this scenario, output power does not saturate at any operating point when the duty cycle is between 0 and 1. Point 516 on curve 512 is the value for the VLINK voltage where output voltage $V_O$ 416 saturates. In this example, the saturation point is shown mathematically to not occur until the duty cycle D is above 1, at about 1.32. Because the graph illustrates that the saturation point does not occur until duty cycle D is above 1, the example system can operate across the entire range of duty cycle D between 0 and 1 without saturating.

Figure 6A:
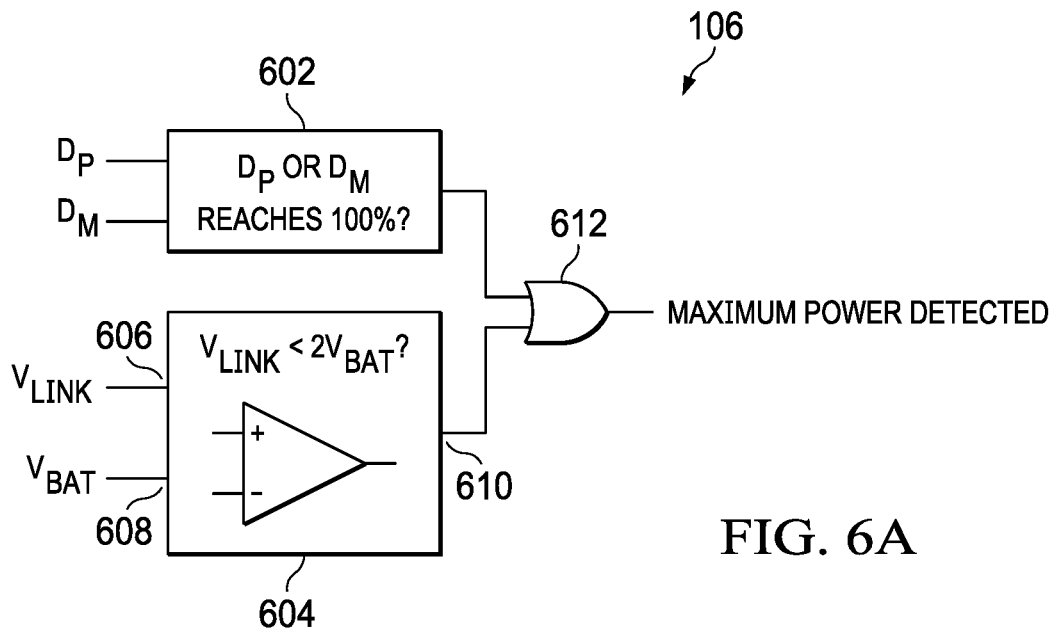
FIG. 6A is a schematic diagram of a maximum power detector in accordance with various examples.

FIG. 6A is a schematic diagram of a maximum power detector 106 for detecting maximum power according to an example. Maximum power detector 106 determines whether either of the two maximum power conditions described above have been met. One condition is whether the duty cycle D reaches 1, or 100%. $D_P$ or $D_M$ can be the duty cycle of the input signal applied to any of the nodes 164, 166, 170, or 174 in FIG. 1. As described above, $D_P$ is the "plus" side PWM signal, and $D_M$ is the "minus" side, which is the inverse of the $D_P$ signal. $D_P$ can be $D_{VLINK\_P}$ or $D_{VBAT\_P}$ in one example. $D_M$ can be $D_{VLINK\_M}$ or $D_{VBAT\_M}$ in one example. A duty cycle detector 602 can detect whether a duty cycle D has reached 1. Duty cycle detector 602 can include any hardware, software, or combination of the two that is configured to determine the duty cycle D. If duty cycle D has reached 1, duty cycle detector 602 can provide a signal indicating that the condition has been met. An example duty cycle detector 602 is described in FIG. 6C below.

Referring again to FIG. 6A, a second condition that indicates maximum power has been reached is whether $V_{LINK} < 2V_{BAT}$, for a 3X charge pump. When $V_{LINK}$ has decreased to this level, $V_O$ is saturated and maximum power has been reached. Any suitable method for detecting this level of $V_{LINK}$ can be used. As one example, a comparator 604 can receive an indication of $V_{LINK}$ voltage at input 606 and an indication of VBAT voltage at input 608. Responsive to $V_{LINK} < 2V_{BAT}$, an output 610 of comparator 604 can provide a signal indicating that the condition has been met. Any other suitable method for determining this condition can be used in other examples.

The output signals from duty cycle detector 602 and comparator 604 can be provided to an OR gate 612. Responsive to either condition being met, OR gate 612 can provide a signal indicating that at least one of the conditions has been met. That signal can then be used to implement additional circuitry that reduces the output power of amplifier 102. This type of additional circuitry is described below in FIG. 7.

Figure 6B:
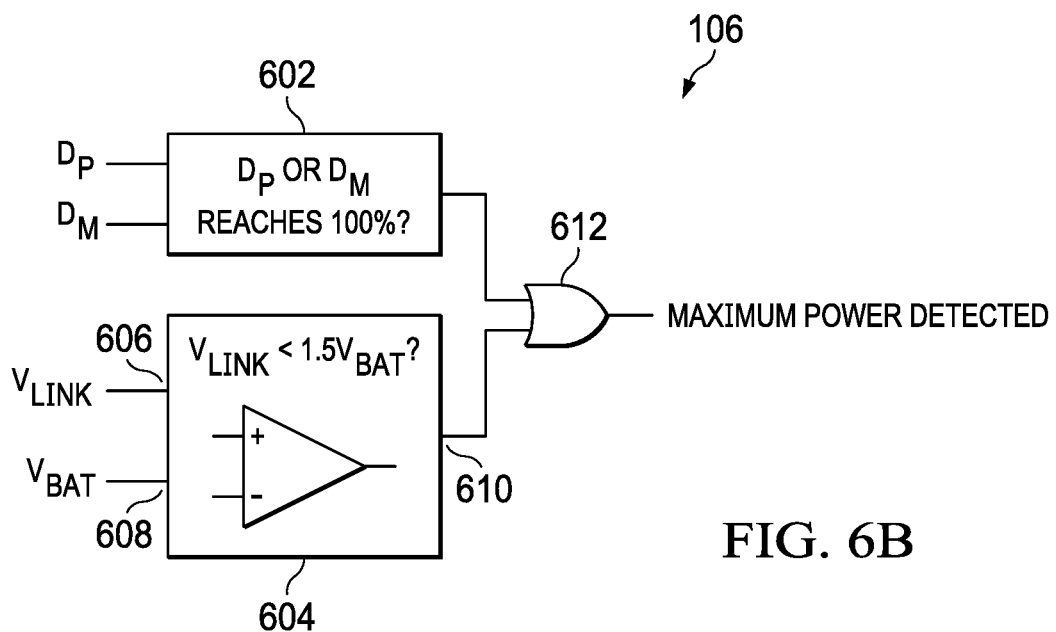
FIG. 6B is a schematic diagram of a maximum power detector in accordance with various examples.

FIG. 6B is a schematic diagram of a maximum power detector 106 for detecting maximum power according to an example. The components of FIG. 6B are similar to the components in FIG. 6A, and operate similarly. However, in FIG. 6B, comparator 604 determines whether $V_{LINK} < 1.5V_{BAT}$. For a 2X charge pump, the appropriate voltage level where the output power is saturated is when $V_{LINK}$ falls below $1.5V_{BAT}$. Responsive to that condition occurring, an output 610 of comparator 604 can provide a signal indicating that the condition has been met.

Figure 6C:
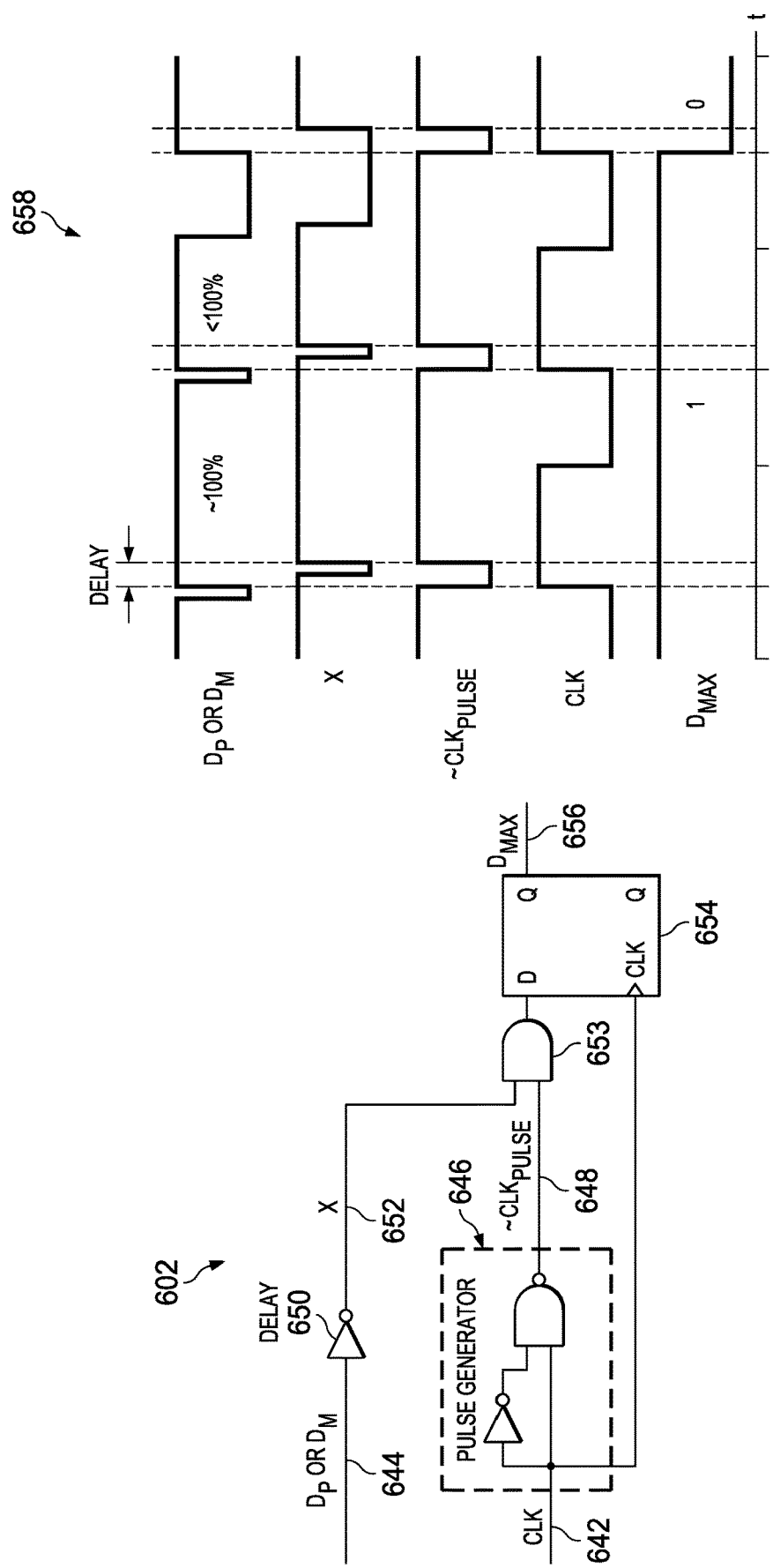
FIG. 6C is a schematic diagram of a duty cycle detector in accordance with various examples.

FIG. 6C is an example of a duty cycle detector 602 in accordance with various examples. Duty cycle detector 602 operates to detect if the duty cycle D has reached approximately 100%. A clock signal CLK 642 is one input to duty cycle detector 602, while a duty cycle signal (Dr or DM) 644 is another input. CLK 642 is provided to a pulse generator 646 with a delay to create a pulse signal $CLK_{PULSE}$ 648, which has a delay behind CLK 642. A PWM duty cycle signal 644 is provided to a delay 650 to undergo a similar delay as $CLK_{PULSE}$ 648. Signal X 652 is the delayed duty cycle signal 644. Signal X 652 and $CLK_{PULSE}$ 648 are sampled by an AND gate 653 at the rising edge of the clock signal CLK 642, and the result is provided to flip-flop 654, which provides a $D_{MAX}$ result signal 656. In the first case, if duty cycle signal 644 is close to 100%, then at the rising edge of clock signal CLK 642, both signal X 652 and $CLK_{PULSE}$ 648 are 1, so $D_{MAX}$ result signal 656 is triggered. In the second case, if duty cycle signal 644 is lower than 100%, then at the rising edge of CLK 642, signal X 652 is zero and $CLK_{PULSE}$ 648 is zero. In that case, $D_{MAX}$ result signal 656 is not triggered. $D_{MAX}$ result signal 656 can then be used in FIG. 6A or 6B as described above to determine if a maximum power condition has been met. Waveforms 658 for the above described signals are graphed on the right side of FIG. 6C.

Figure 6D:
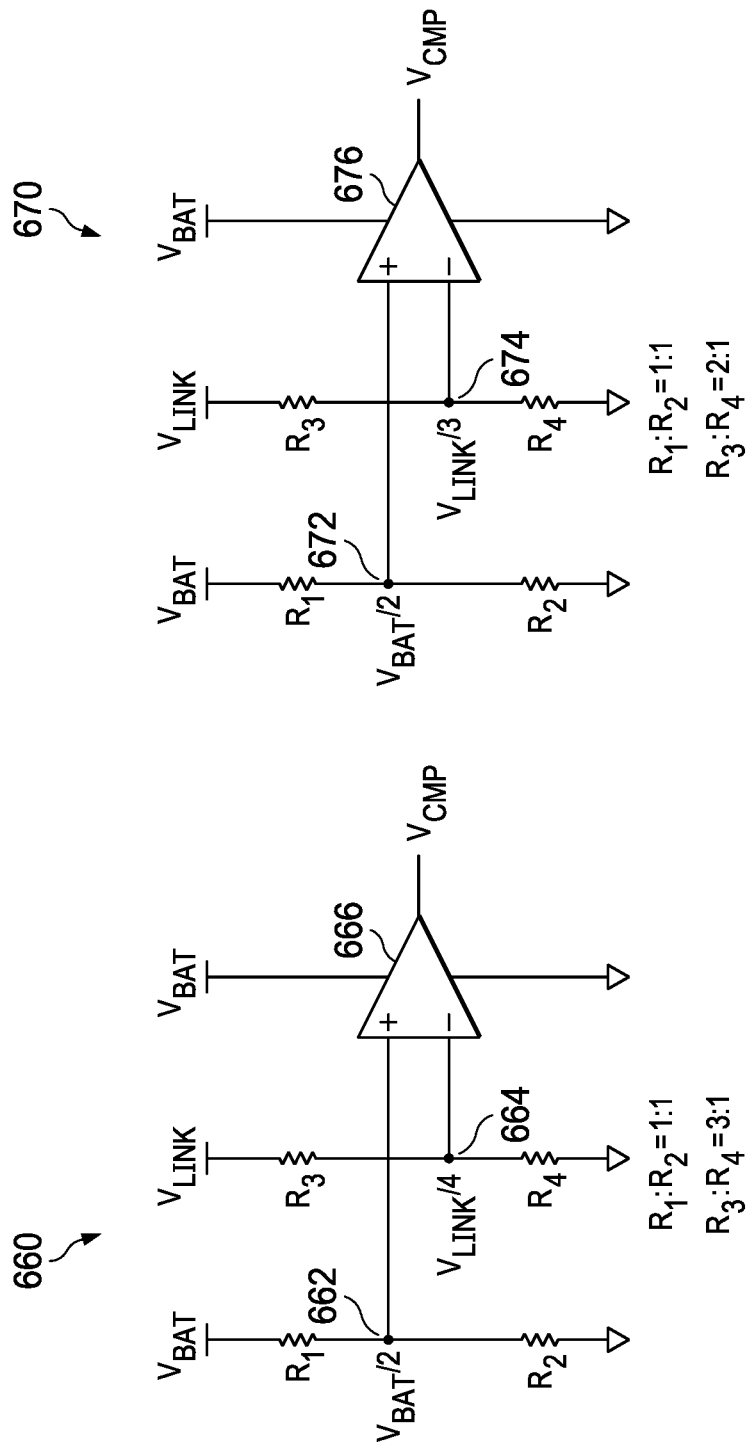
FIG. 6D is a schematic diagram of circuits for maximum power detection in accordance with various examples.

FIG. 6D are circuits 660 and 670 for maximum power detection according to various examples. Circuits 660 and 670 determine whether $V_{LINK}$ has dropped below a predetermined multiple of $V_{BAT}$. Circuit 660 provides a system for determining whether $V_{LINK} < 2V_{BAT}$, for a 3X charge pump. Circuit 670 provides a system for determining whether $V_{LINK} < 1.5V_{BAT}$, for a 2X charge pump.

In circuit 660, a voltage ratio R1:R2 of 1:1 produces a voltage of $V_{BAT}/2$ at node 662. A voltage ratio of R3:R4 of 3:1 produces a voltage of $V_{LINK}/4$ at node 664. The voltages at nodes 662 and 664 are provided to comparator 666. The output $V_{CMP}$ of comparator 666 indicates whether $V_{LINK} < 2V_{BAT}$. The output $V_{CMP}$ of comparator 666 can be used in FIG. 6A as described above to determine if a maximum power condition has been met.

In circuit 670, a voltage ratio R1:R2 of 1:1 produces a voltage of $V_{BAT}/2$ at node 672. A voltage ratio of R3:R4 of 2:1 produces a voltage of $V_{LINK}/3$ at node 674. The voltages at nodes 672 and 674 are provided to comparator 676. The output $V_{CMP}$ of comparator 676 indicates whether $V_{LINK} < 2V_{BAT}$. The output $V_{CMP}$ of comparator 676 can be used in FIG. 6B as described above to determine if a maximum power condition has been met.

Figure 7:
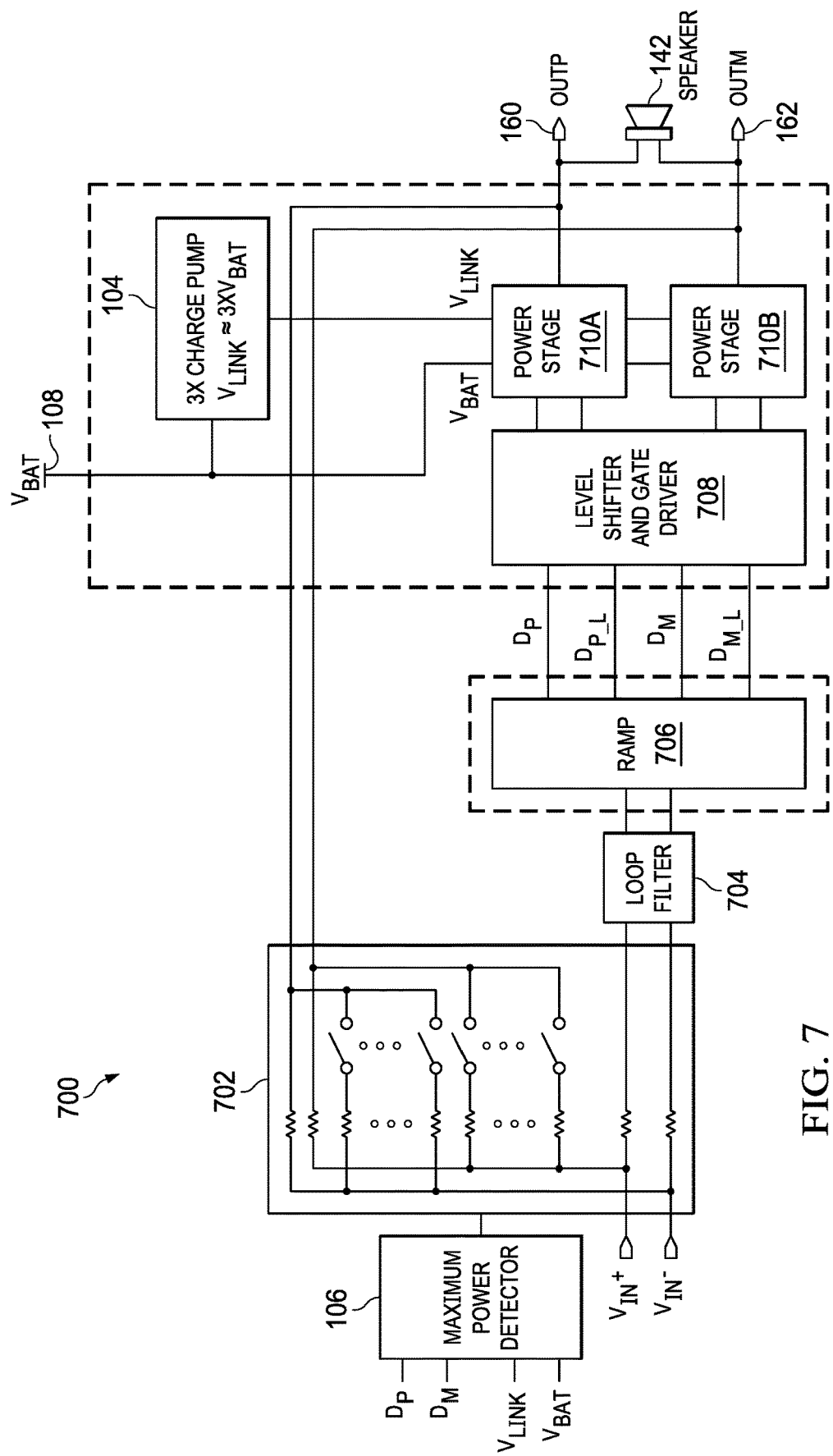
FIG. 7 is a schematic diagram of a system for adjusting output power responsive to maximum power having been detected, in accordance with various examples.

FIG. 7 is a schematic diagram of a system 700 for adjusting output power responsive to maximum power being detected, according to an example. System 700 includes charge pump 104, maximum power detector 106, load 142, gain controller 702, loop filter 704, ramp comparator 706, level shifter and gate driver 708, and power stages 710A and 710B. Maximum power detector 106 is coupled to gain controller 702. Loop filter 704 is coupled to ramp comparator 706. Ramp comparator 706 provides PWM signals to level shifter and gate driver 708. Level shifter and gate driver 708 is coupled to power stages 710A and 710B. Power stages 710A and 710B are also coupled to charge pump 104. Also, gain controller 702 is coupled to loop filter 704 and output nodes 160 and 162.

In an example, maximum power detector 106 receives inputs such as duty cycle D, $V_{LINK}$, and $V_{BAT}$. With these inputs, maximum power detector 106 detects whether any of the conditions that indicate maximum power have occurred. If so, maximum power detector 106 produces a maximum power signal that is used by other components of system 700 to reduce output power of system 700.

In one example, a maximum power signal from maximum power detector 106 is provided to gain controller 702. Responsive to gain controller 702 receiving the maximum power signal, gain controller 702 reduces gain in the input stage of system 700 to reduce output power of system 700. In this example, gain controller 702 includes a set of resistors and switches. Resistors can be switched into and out of the gain controller 702 to raise or lower the gain in the input stage. In one example, a controller or other circuitry (not shown) receives a signal from maximum power detector 106 and, based on that signal, switches resistors into or out of the gain circuit in gain controller 702. In another example, gain controller 702 could also include internal circuitry that directly receives a signal from maximum power detector 106 and adjusts the gain circuit in gain controller 702. By reducing the gain in gain controller 702, the output power can be reduced. In other examples, a different type of circuit is useful to reduce the gain. In still other examples, any suitable method or system for reducing output power can be implemented responsive to the maximum power being detected by maximum power detector 106.

System 700 also includes loop filter 704. Loop filter 704 can be used to compensate for non-linear factors and produce a filtered signal that is transmitted to ramp comparator 706. In some example embodiments, loop filter 704 includes an integrator (e.g. a two-output comparator with one input connected to one output with a capacitor and the second input connected to the second output with a capacitor) in series with a summer (e.g. a two-output comparator with one input connected to one output of the integrator and the other input connected to the second output of the integrator). Ramp comparator 706 receives one or more input signals and provides one or more pulse width modulated signals. In this example, the ramp comparator 706 provides pulse width modulated signals $D_P$, $D_{P\_L}$, $D_M$, and $D_{M\_L}$ and provides these signals to level shifter and gate driver 708. These signals are the PWM signals applied to nodes 164, 166, 170, and 174 in FIG. 1 in one example (e.g., $D_{VLINK\_P}$, $D_{VLINK\_M}$, $D_{VBAT\_P}$, and $D_{VBAT\_M}$).

The output stage of system 700 includes charge pump 104, level shifter and gate driver 708, and power stages 710A and 710B (e.g., including power transistors) in this example. In some example embodiments, power stage 710A includes transistors 144, 148, 152 and 154 and invertors 176 and 168; power stage 710B includes transistors 146, 150, 156 and 158 and inverters 172 and 178; and each are configured as is shown in FIG. 1 as amplifier 102. The output signals at output nodes 160 and 162 are provided by the output stage and provided to load 142, which is a speaker in one example. The OUTP and OUTM signals at output nodes 160 and 162, respectively, are useful as feedback signals to gain controller 702 in one example.

Figure 8:
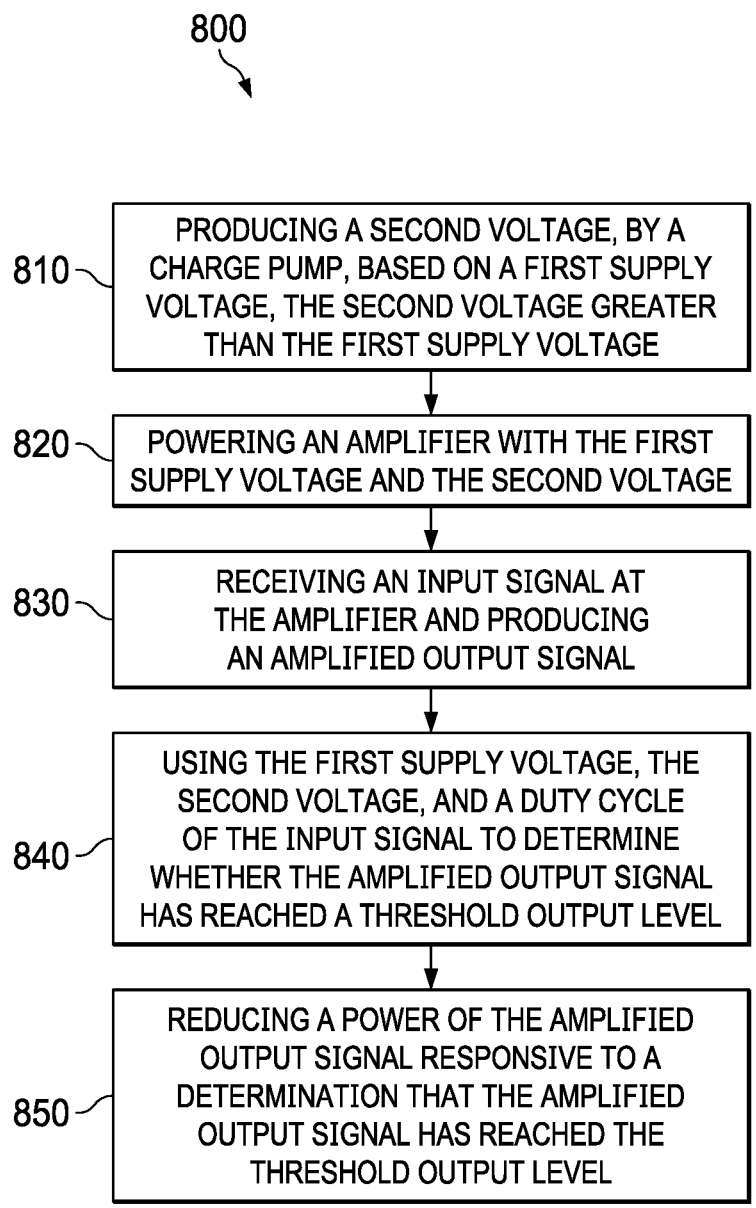
FIG. 8 is a flowchart of a method for maximum power detection in accordance with various examples.

FIG. 8 is a flowchart of a method 800 for maximum power detection in accordance with various examples. Although the method is described with reference to FIGS. 1-7, any system configured to perform the method 800, in any suitable order, falls within the scope of this description. In one example, the components in FIGS. 1 and/or 7 perform method 800.

Method 800 begins at 810, where a charge pump 104 produces a second voltage based on a first supply voltage, the second voltage greater than the first supply voltage. As described above, the first supply voltage can be VBAT and the second voltage can be VLINK produced by a charge pump 104. In a 3X charge pump, the second voltage is three times the first voltage. Other charge pump multiples can be used in other examples.

Method 800 continues at 820, where the first supply voltage and the second voltage power an amplifier. The first supply voltage and the second voltage are used for the various operating modes of a class-D amplifier in an example. In a low power operating mode, the first supply voltage provides power for the class-D amplifier. In a mid power or high power operating mode, the class-D amplifier uses a voltage for power that is higher than the first supply voltage, and could be as high as the second voltage.

Method 800 continues at 830, where the class-D amplifier receives an input signal and produces an amplified output signal. For example, the input signal can be an audio signal that is amplified to produce an output audio signal at a speaker. The input signal can be a pulse width modulated signal in examples. In one example multi-level class-D amplifier, a pulse width modulated signal is provided to at least one of four input nodes as shown in FIGS. 1, 3A and 3B.

Method 800 continues at 840, where the first supply voltage, the second voltage, and a duty cycle of the input signal are used to determine whether the amplified output signal has reached a threshold output level. In one example, detecting a duty cycle of 1 indicates that amplifier 102 is operating at maximum output power, which is a threshold output level. In another example, detecting that the second voltage (WINK) has fallen below a multiple of the first supply voltage ($V_{BAT}$) indicates that amplifier 102 is operating at maximum output power. Maximum power detector 106 can include any suitable hardware or software to detect these conditions. In other examples, other conditions can be detected that indicate maximum output power or a threshold output level has been reached.

Method 800 continues at 850, where a power of the amplified output signal is reduced responsive to a determination that the amplified output signal has reached the threshold output level. Any suitable method or process can be used to reduce the power of the output signal. In one example, gain controller 702 reduces a gain of the input stage of an amplifier system to reduce the power of the output signal (e.g., by switching resistors in and out of the gain circuit). In other examples, other methods can be used to reduce output power.

The term "couple" is used throughout the specification. The term may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end-user and/or a third-party.

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While particular transistor structures are referred to above, other transistors or device structures may be used instead. For example, p-type MOSFETs may be used in place of n-type MOSFETs with little or no additional changes. In addition, other types of transistors (such as bipolar transistors) may be utilized in place of the transistors shown. The capacitors may be implemented using different device structures (such as metal structures formed over each other to form a parallel plate capacitor) or may be formed on layers (metal or doped semiconductors) closer to or farther from the semiconductor substrate surface.

As used above, the terms "terminal", "node", "interconnection" and "pin" are used interchangeably. Unless specifically stated to the contrary, these terms are generally used to mean an interconnection between or a terminus of a device element, a circuit element, an integrated circuit, a device or other electronics or semiconductor component.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means +/− 10 percent of the stated value. Modifications are possible in the described examples, and other examples are possible within the scope of the claims.

What is claimed is:

1. A method, comprising:
   receiving a switching signal having a duty cycle;
   responsive to a switching signal have a first state, connecting an output terminal to a first voltage source, in which the first voltage source provides a first voltage above a ground voltage; and
   responsive to the switching signal having a second state, connecting the output terminal to a second voltage source, in which the second voltage source provides a second voltage above the ground voltage, to provide a third voltage at the output terminal based on the first and second voltages and the duty cycle.

2. The method of claim 1, wherein the first voltage source includes a charge pump.

3. The method of claim 2, wherein the charge pump is a capacitive charge pump.

4. The method of claim 1, wherein the switching signal is a first switching signal, and the method further comprises:
   receiving a second switch signal;
   responsive to the second switching signal having a first state, connecting the output terminal to one of the first or second voltage sources; and
   responsive to the second switching signal having a second state, connecting the output terminal to the ground voltage.

5. The method of claim 4, wherein the first switching signal is received in a high power mode, and the second switching signal is received in an idle mode or in a low power mode.

6. The method of claim 1, further comprising:
   adjusting a signal power at the output terminal responsive to at least one of: a duty cycle of the switching signal reaching a duty cycle threshold, or the second voltage being below a voltage threshold, the voltage threshold being based on the first voltage.

7. The method of claim 6, wherein the duty cycle threshold equals one.

8. The method of claim 6, wherein the voltage threshold is based on a multiple of the first voltage.

9. The method of claim 8, wherein the first voltage is three times of the second voltage, and the multiple is two.

10. The method of claim 8, wherein the first voltage is twice of the second voltage, and the multiple is 1.5.

11. The method of claim 6, further comprising:
    generating the switching signal from an input signal using an input stage,
    wherein adjusting the signal power at the output terminal includes adjusting a gain of the input stage.

12. A system, comprising:
    a first transistor coupled between a first voltage terminal and an output terminal, the first transistor having a first control terminal coupled to a switching input, and the first transistor configured to receive a first voltage at the first voltage terminal, in which the first voltage is above a ground voltage;
    a second transistor coupled between a second voltage terminal and the output terminal, the second transistor having a second control terminal coupled to the switching input, and the second transistor configured to receive a second voltage at the second voltage terminal, in which the second voltage is above the ground voltage; and
    a control circuit having a control input coupled to at least one of the switching input, the first voltage terminal, or the second voltage terminal, the control circuit configured to provide a switching signal having a duty cycle at the switching input, in which the first and second transistors are configured to, responsive to the switching signal have a first state, provide the first voltage at the output terminal, and responsive to the switching signal having a second state, provide the second voltage at the output terminal, to provide a third voltage at the output terminal based on the first and second voltages and the duty cycle.

13. The system of claim 12, wherein the first and second transistors are part of a class-D multi-stage amplifier, and the switching signal is a pulse-width modulated signal.

14. The system of claim 12, further comprising a charge pump coupled to the first voltage terminal.

15. The system of claim 14, wherein the charge pump is a capacitive charge pump.

16. The system of claim 12, wherein the switching input is a first switching input, and the system further comprises a third transistor coupled between the second transistor and the output terminal, and a fourth transistor coupled between the output terminal and a ground terminal, the third and fourth transistors having respective third and fourth control terminals coupled to a second switching input, and the fourth transistor is configured to receive the ground voltage at the ground terminal.

17. The system of claim 12, wherein the control circuit is configured to adjust a signal power at the output terminal responsive to at least one of: a duty cycle of a switching signal at the switching input reaching a duty cycle threshold, or the second voltage being below a voltage threshold, the voltage threshold being based on the first voltage.

18. The system of claim 17, wherein the duty cycle threshold equals one.

19. The system of claim 17, wherein the voltage threshold is based on a multiple of the first voltage.

20. The system of claim 19, wherein the first voltage is three times of the second voltage, and the multiple is two.

21. The system of claim 17, wherein the duty cycle threshold and the voltage threshold are based on a maximum power at the output terminal.

22. The system of claim 17, further comprising an input stage coupled between a first input and the switching input, wherein the control circuit is configured to adjust the signal power based on adjusting a gain of the input stage.

23. The system of claim 22, wherein the control circuit is configured to adjust the signal power based on adjusting a resistance between the first input and the output terminal.

24. The system of claim 12, wherein the switching signal is a first switching signal, and the control circuit is configured to provide a second switch signal at the switching input, and the first and second transistors are configured to, responsive to the second switching signal having a first state, provide one of the first or second voltages at the output terminal, and responsive to the second switching signal having a second state, provide the ground voltage at the output terminal.

25. The system of claim 24, wherein the control circuit is configured to provide the first switching signal in a high power mode, and provide the second switching signal in a low power mode or an idle mode.

26. The system of claim 12, wherein the output terminal is coupled to a speaker terminal.

27. A system, comprising:
    a switch circuit having a first voltage terminal, a second voltage terminal, a switching input, and an output terminal, the switch circuit configured to:
        receive a switching signal at the switching input;
        receive a first voltage at the first voltage terminal, in which the first voltage is above a ground voltage;
        receive a second voltage at the second voltage terminal, in which the second voltage is above the voltage at the ground terminal;
        responsive to the switching signal having a first state, connect the output terminal to the first voltage terminal; and
        responsive to the switching signal having a second state, connecting the output terminal to the second voltage terminal; and
    a control circuit having a control input coupled to at least one of the switching input, the first voltage terminal, or the second voltage terminal, the control circuit configured to provide a switching signal at the switching input, in which the switch circuit is configured to, responsive to the switching signal have a first state, provide the first voltage at the output terminal, and responsive to the switching signal having a second state, provide the second voltage at the output terminal.

28. The system of claim 27, wherein the switching input is a first switching input, and the switch circuit has a second switching input and configured to:
    responsive to the second switching input having a first state, connect the output terminal to one of the first or second voltage terminals responsive to a state of the first switching input; and
    responsive to the second switching signal having a second state, connect the output terminal to the ground terminal.

29. The system of claim 27, wherein the control circuit is configured to adjust a signal power at the output terminal responsive to at least one of: a duty cycle of the switching signal reaching a duty cycle threshold, or the second voltage being below a voltage threshold, the voltage threshold being based on the first voltage.

30. The system of claim 29, wherein the duty cycle threshold equals one.

31. The system of claim 29, wherein the voltage threshold is based on a multiple of the first voltage.

32. The system of claim 29, further comprising an input stage coupled between a first input and the switching input, wherein the control circuit is configured to adjust the signal power at the output terminal based on adjusting a gain of the input stage.

33. The system of claim 27, wherein the switching signal is a first switching signal, and the control circuit is configured to provide a second switch signal at the switching input, and the switch circuit is configured to, responsive to the second switching signal having a first state, provide one of the first or second voltages at the output terminal, and responsive to the second switching signal having a second state, provide the ground voltage at the output terminal.

34. The system of claim 33, wherein the control circuit is configured to provide the first switching signal in a high power mode, and provide the second switching signal in a low power mode or an idle mode.

35. The system of claim 27, wherein the output terminal is coupled to a speaker terminal.

* * * * *